(12) United States Patent
Zhang et al.

(10) Patent No.: US 8,399,997 B2
(45) Date of Patent: Mar. 19, 2013

(54) POWER PACKAGE INCLUDING MULTIPLE SEMICONDUCTOR DEVICES

(75) Inventors: Jiangyuan Zhang, Shanghai (CN); Elite Lee, Shanghai (CN); Dana Liu, Shanghai (CN)

(73) Assignee: Shanghai Kalhong Electronic Company Limited, Shanghai (CN)

( * ) Notice: Subject to any disclaimer, the term of this patent is extended or adjusted under 35 U.S.C. 154(b) by 124 days.

(21) Appl. No.: 13/158,244

(22) Filed: Jun. 10, 2011

(65) Prior Publication Data

US 2012/0313232 A1  Dec. 13, 2012

(51) Int. Cl.
*H01L 23/48* (2006.01)

(52) U.S. Cl. ........... 257/782; 257/783; 257/E21.514; 257/E23.04; 438/111; 438/119

(58) Field of Classification Search ........ 257/782, 257/783, E21.514, E23.04; 438/111, 119
See application file for complete search history.

(56) References Cited

U.S. PATENT DOCUMENTS

| | | | |
|---|---|---|---|
| 6,236,109 B1 * | 5/2001 | Hsuan et al. | 257/688 |
| 7,772,047 B2 * | 8/2010 | Liao et al. | 438/132 |
| 7,834,433 B2 * | 11/2010 | Xiaochun et al. | 257/675 |
| 2009/0072361 A1 * | 3/2009 | Shen et al. | 257/670 |
| 2011/0057298 A1 * | 3/2011 | Ramos et al. | 257/667 |
| 2012/0164793 A1 * | 6/2012 | Shi et al. | 438/119 |

* cited by examiner

*Primary Examiner* — Trung Q Dang
(74) *Attorney, Agent, or Firm* — Yingsheng Tung

(57) ABSTRACT

In one embodiment, a method includes attaching a film to cover a first portion of a first semiconductor die. The first semiconductor die is attached, using the tape, to a lead frame using a first bonding method. The first bonding method places the film between the lead frame and the semiconductor die. A second semiconductor die is attached to the lead frame using a second bonding method. The second bonding method bonds the lead frame and the semiconductor die. The first semiconductor device and the second semiconductor device are encapsulated into a semiconductor package.

20 Claims, 9 Drawing Sheets

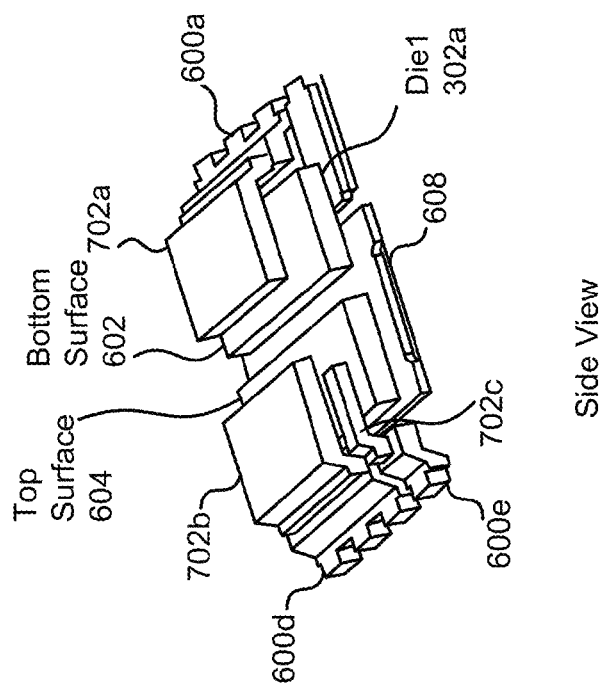
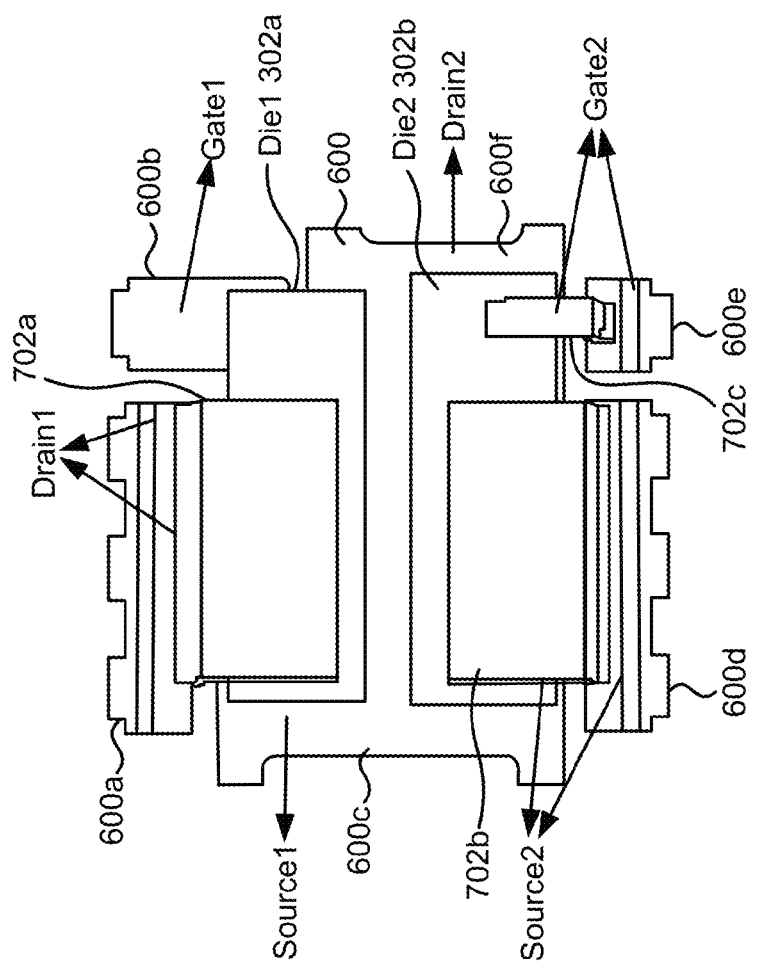
Fig. 7b Side View
Fig. 7a Top View

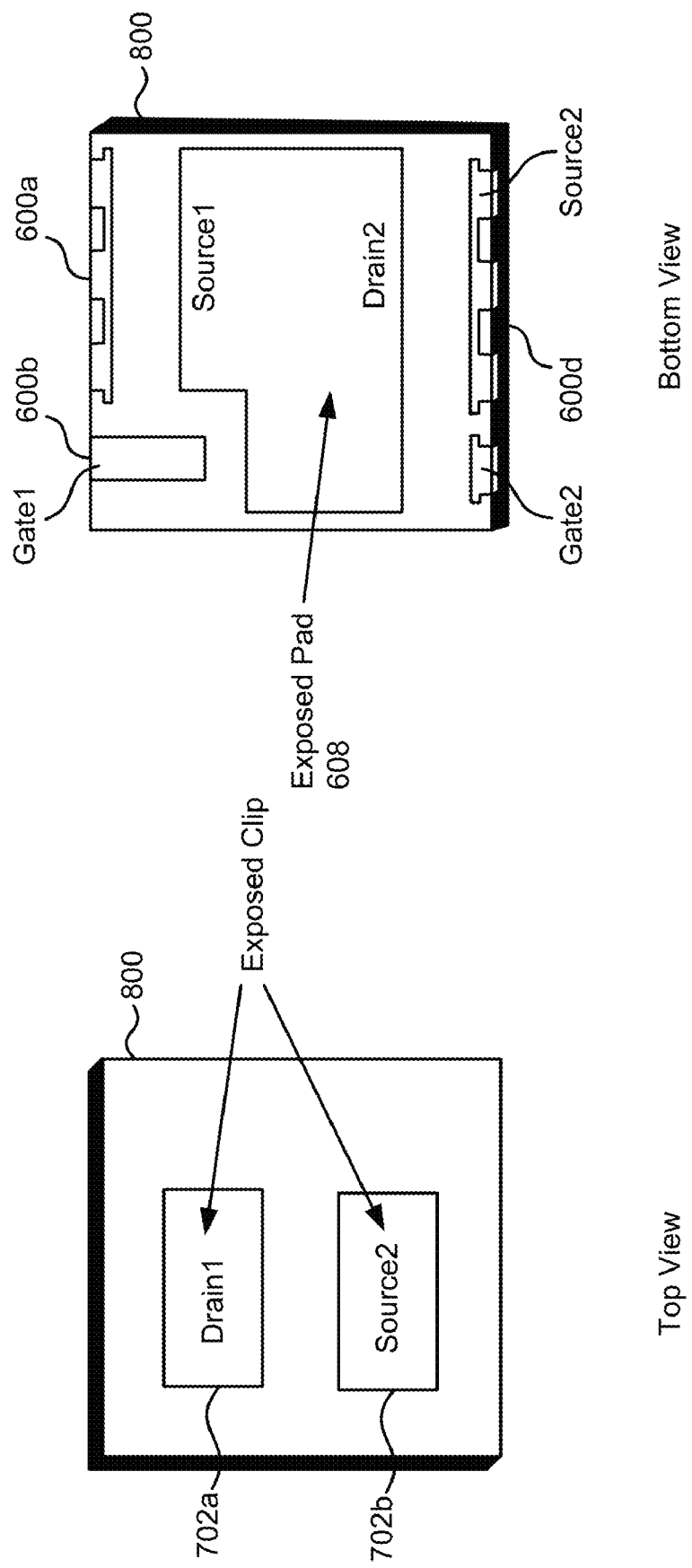

POWER PACKAGE INCLUDING MULTIPLE SEMICONDUCTOR DEVICES

BACKGROUND

Particular embodiments generally relate to power packages.

With the continual development of the electronics industry, an increasing number of devices are being integrated on printed circuit boards (PCB), and therefore the miniaturization of devices has become an inevitable trend in the development of device encapsulation technology. Single devices that occupy smaller areas enable the PCB to accommodate more devices per unit area, thereby providing greater room for compromise between miniaturization and high performance for the board designer.

With the rapid upgrade of electrical production, small, thin, and lightweight packages are a trend for electrical devices. In a dual-power application, multiple metal oxide semiconductor field effect transistor (MOSFET) devices may be included. A CMOS circuit is the most common unit on a PCB. CMOS circuits often require several NMOS and PMOS, for example a CMOS inverter requires at least one NMOS and one PMOS. Early single supply SO8 packages occupied an area of 5 mm×6 mm on the PCB. However, owing to being single tube encapsulation, two packages are required to realize one basic CMOS unit. This may use more printed circuit board (PCB) area due to using two packages.

These have been superseded by the dual-power PAK SO8 packages. Although the monomer in the package simultaneously encloses two MOSFETs, the two grid leads at the high side and the low side must intersect on the PCB because of the package structure. Therefore a PCB with at least two layers is required, thereby increasing the application cost and hampering more wide-reaching applications. However, this design is not optimized for a layout with a pulse width modulation (PWM) controller. To connect both high side and low side gate pins to PWM controllers, a trace overlap needs to occur in the PCB design. The PCB design thus has multiple layers and a one-layer PCB design is not geometrically possible. This increases the cost of the package.

SUMMARY

In one embodiment, a method includes attaching a film on a tape in a position to cover a first portion of a first semiconductor die and attaching, using the tape, the film to the first semiconductor die to cover the first position on the first semiconductor die. The first semiconductor die is attached, using the tape, to a lead frame using a first bonding method. The first bonding method places the film between the lead frame and the semiconductor die. A second semiconductor die is attached to the lead frame using a second bonding method. The second bonding method bonds the lead frame and the semiconductor die. The first semiconductor device and the second semiconductor device are encapsulated into a semiconductor package.

In one embodiment, the tape comprises a second tape. The method further includes placing a first tape onto a wafer and placing the film onto the second tape. The film is shaped to cover the first portion of a plurality of semiconductor dies on the wafer.

In one embodiment, the method shapes the film to be a plurality of single die sizes at a position corresponding to a plurality of die pad positions on the plurality of semiconductor dies.

In one embodiment, the method places the second tape and the film onto the wafer and attaches the film to the first portion of the plurality of semiconductor dies.

In one embodiment, the first bonding process includes a flip bond process where a top side of the first semiconductor die faces the lead frame.

In one embodiment, the second bonding process includes a solder paste bond process where a bottom side of the second semiconductor die is bonded to the lead frame using a paste.

In another embodiment, a method attaches a first tape onto a wafer. The method also attaches a film onto a second tape to cover a portion of a plurality of semiconductor dies on the wafer. Using the second tape, the film is attached to the plurality of semiconductor dies on the wafer. The plurality of semiconductor dies on the wafer are singulated. A first semiconductor die from the plurality of singulated semiconductor dies is bonded to a lead frame using a first bonding method placing a top surface of the first semiconductor die including the film facing the lead frame. A second semiconductor die is bonded to the lead frame using a second bonding method placing a bottom surface of the second semiconductor die facing the lead frame.

In one embodiment, a semiconductor package includes a lead frame including a die pad, a first semiconductor die including a top surface coupled to the die pad using a film, and a second semiconductor die including a bottom surface coupled to the die pad. An encapsulation molding encapsulates the first semiconductor device and the second semiconductor device into the semiconductor package. A bottom surface of the first semiconductor die is exposed from the encapsulation via a first bond to the bottom surface of the first semiconductor die. A top surface of the second semiconductor die is exposed from the encapsulation via a second bond to the top surface of the second semiconductor die. The die pad is exposed from the encapsulation.

The following detailed description and accompanying drawings provide a better understanding of the nature and advantages of the present invention.

BRIEF DESCRIPTION OF THE DRAWINGS

FIG. 7a shows an example of a clip bond processing step according to one embodiment.

FIG. 7b shows a side view of the clip bond processing step according to one embodiment.

FIG. 9a shows a top view of the package according to one embodiment.

FIG. 9b shows a bottom view of the package according to one embodiment.

DETAILED DESCRIPTION

Described herein are techniques for a power package including multiple semiconductor devices. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Particular embodiments provide a power MOSFET package and encapsulation method that can further reduce the occupied area of the package, as well as to provide a suitable position for the base pins which facilitates PCB routing design. For example, particular embodiments provide a package that includes two semiconductor devices, such as two MOSFETs. The package saves printed circuit board (PCB) space. For example, the assembly process simplifies the PCB routing process and the PCB has fewer layers, which lowers cost for the package. The package is also thin and small in the power package family, and includes good performance at thermal and package resistance.

Figure 1:
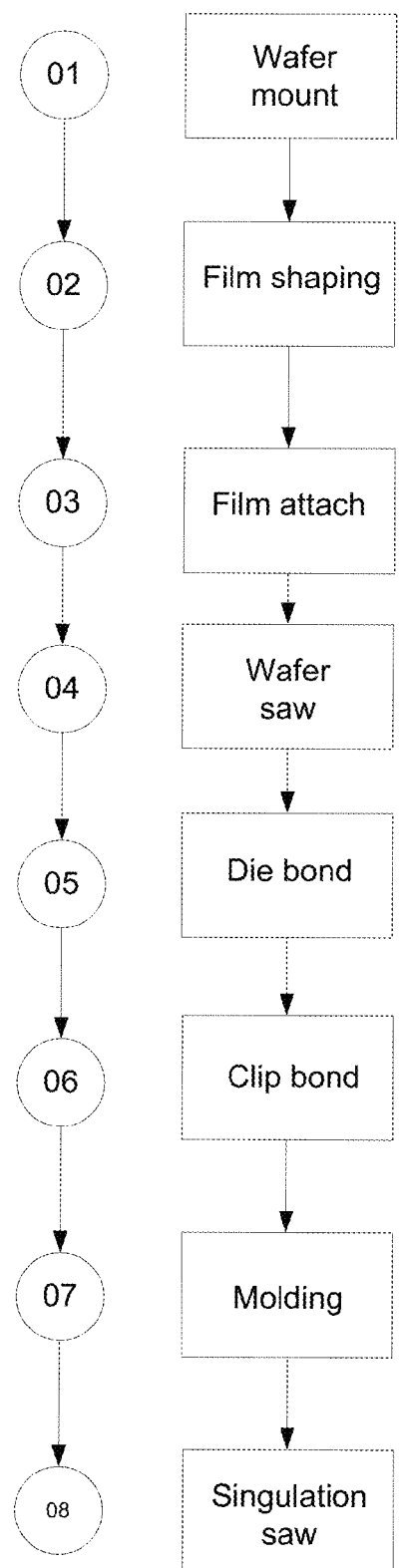
FIG. 1 depicts a simplified flowchart of a method for manufacturing a package according to one embodiment.
Figure 2:
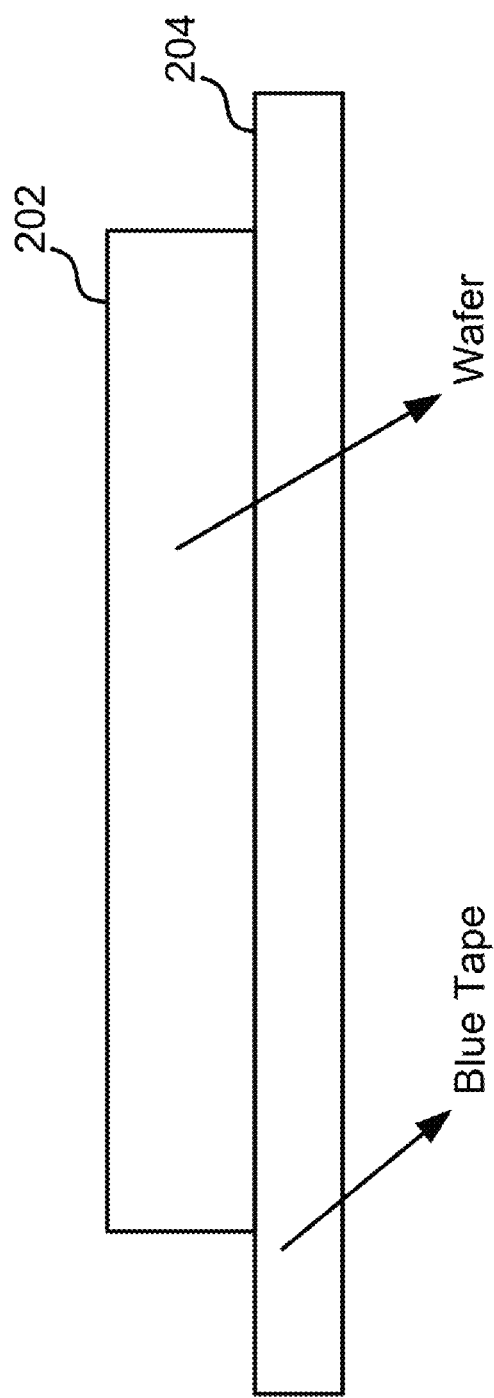
FIG. 2 depicts a more detailed example of step 01 according to one embodiment.

FIG. 1 depicts a simplified flowchart 100 of a method for manufacturing a package according to one embodiment. At 01, a wafer mount processing step is performed. FIG. 2 depicts a more detailed example of step 01 according to one embodiment. A wafer 202 is mounted on blue tape 204. Blue tape 204 may be plastic tape or other adhesive material that is adhered to wafer 202. Blue tape 204 is used to keep the semiconductor dies of wafer 202 in place after the semiconductor dies are singulated by a sawing step, which will be described in more detail below.

Referring back to FIG. 1, at 02, a film shaping processing step is performed. In this case, a special film is mounted on a second blue tape. FIG. 3a shows an example of film 306 being mounted on second blue tape 205 according to one embodiment. Second blue tape 205 will be used in the next step to attach the film to wafer 202.

The film is put in a machine in which the film can be shaped to a specific size. For example, the film is shaped to a single die pad (or paddle) size according to the pad size and paddle position corresponding to die pad positions on wafer 202. The other part of the film is cleared away. For example, the film is shaped over a position in which die pads in a package at a later step will be placed. The film is conductive and adhesive on both sides. In one embodiment, there is a different adhesive level on both sides. The film has a viscosity at one temperature on both sides, which is conductive. This conductivity will couple a die to a lead frame. The method of formation of conductive film is the pasting method, in which a continuous conductive film that is prepared in advance is pasted on the blue film as support layer. Other methods such as spin coating or spraying can also be adopted to form conductive films coated on the surface of support layer in other embodiments, and a continuous solid-state conductive film is formed after the curing process. The conductive film is a resin film with metallic composition. Specifically, the metal can be silver; the resin film with metallic composition can further contain solder in order to improve the viscosity and conductivity of the film. Other conductive material can be used, such as solder, but it is a riskier process if solder is used as conductive material.

Figure 3B:
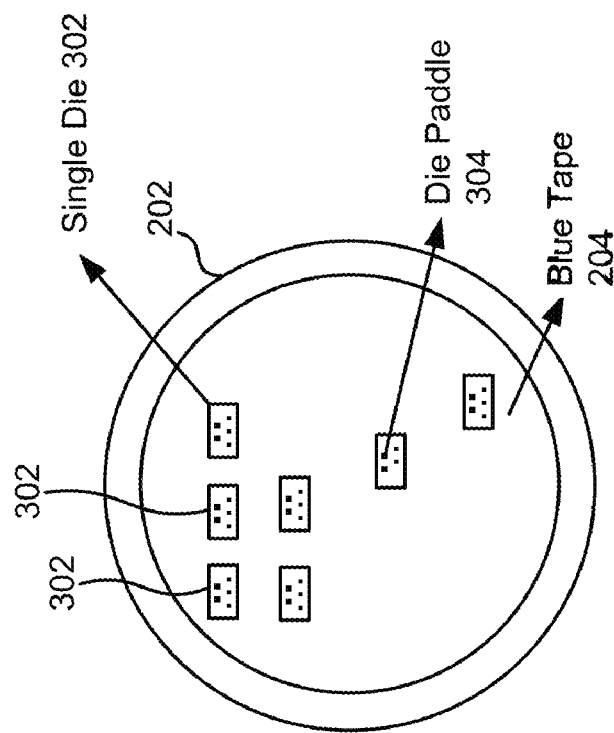
FIG. 3b shows an example of the film shaping processing step according to one embodiment.
Figure 3A:
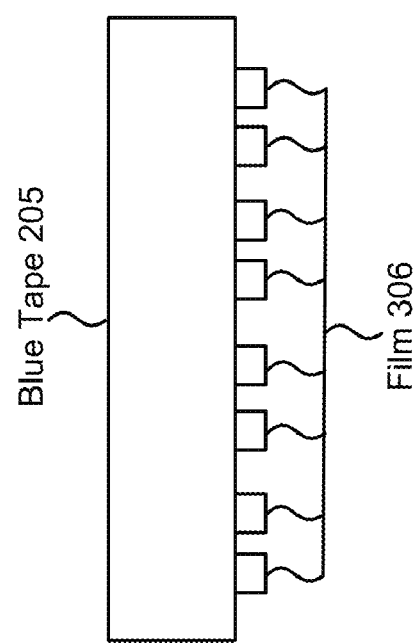
FIG. 3a shows an example of a film being mounted on a second blue tape according to one embodiment.

FIG. 3b shows an example of the film shaping processing step according to one embodiment. Wafer 202 and blue tape 204 are shown. Different dies 302 are shown for an example. It will be understood that other dies may be included but are not shown. Film 306 is shaped to cover die paddle positions 304. A positioning system is used to position second blue tape 205 (not shown) and the film over die paddle positions 304. For example, positioning using wafer 202 is used to determine where die paddle positions 304 will be located.

Particular embodiments graphically array film 306 such that its position and shape correspond to with that of the bonding pads on the front of the wafer 202 (not shown in the diagram). Individual conductive film lugs (film 306) are used to indicate the graphical structures that are formed after graphical array. The steps to graphically array film 306 include: identifying the position of the front pad on wafer 202 and mapping its image to the film shaping device; graphically arraying film 306 so that it has the shape of the corresponding pads by using the film shaping device, and removing the excess parts.

Referring back to FIG. 1, at 03, a film attach processing step is performed. In this step, wafer 202 is covered with second blue tape 205 at a temperature that was used to finish the wafer mount process. Blue tape 205 is then removed after film 306 is adhered to die 302.

In one embodiment, the two surfaces of the film 306 have different adhesion strength, and the surface with the lower adhesion strength is pasted with the support layer 180, which facilitates the removal of blue tape 205 after attaching to the wafer 202. Thus blue tape 205 can be directly removed in this step, and as the adhesion strength is stronger between film 306 and the wafer 202, they will not be removed alongside blue tape 205, but rather will stay on the surface of the wafer 202.

Figure 4:
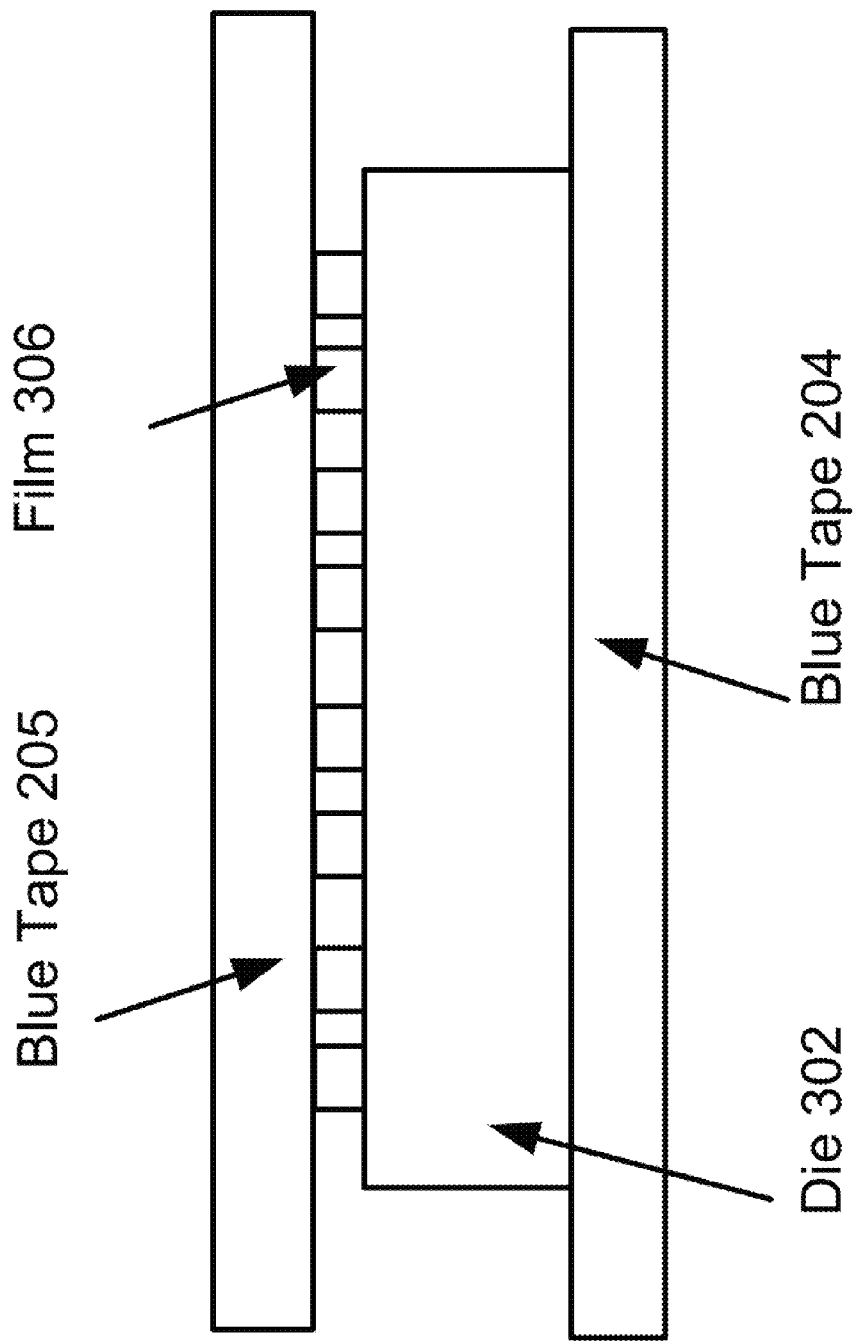
FIG. 4 shows an example of a side view of a die from a wafer according to one embodiment.

FIG. 4 shows an example of a side view of a die 302 from wafer 202 according to one embodiment. Other dies are not shown, but have film 306 attached in a similar fashion. As shown, second blue tape 205 includes film 306. Additionally, blue tape 204, which was previously attached during the wafer mount step at 01, is attached to a bottom surface of die 302. Heat is applied to film 306 at a temperature that was used to finish the wafer mount process at 01 to attach film 306 to die 302. Second blue tape 205 is then removed. Film 306 is attached to die 302 at positions in which die 302 will be attached to a die pad at a future step.

Referring back to FIG. 1, at 04, a wafer saw processing step is performed. In this case, wafer 202 is sawed to singulate wafer 202 into multiple dies 302. FIG. 5a shows a side view after singulation. Wafer 202 has been singulated into multiple dies 302 that are still attached to blue tape 204. In this case, the sawing is performed on the front side of dies 302 to singulate them.

Figure 5B:
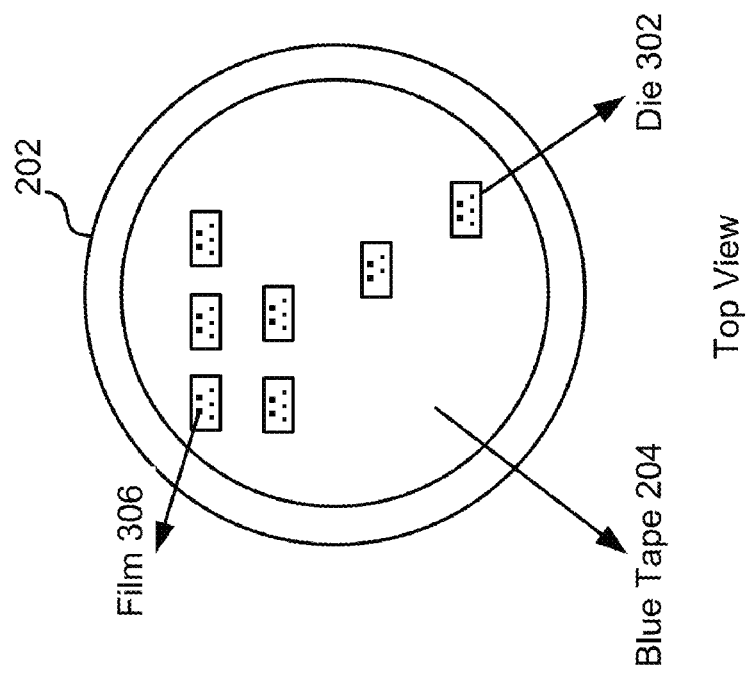
FIG. 5b shows a top view of the wafer saw processing step processing step according to one embodiment.
Figure 5A:
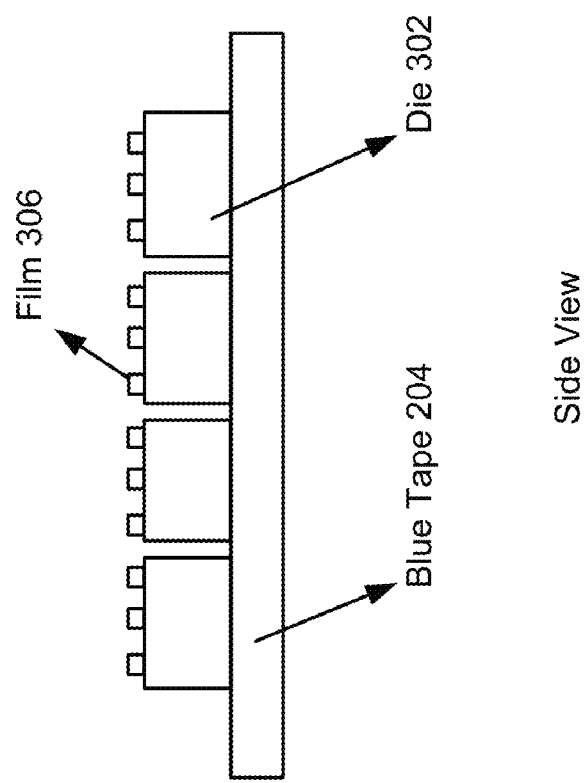
FIG. 5a shows a side view after singulation according to one embodiment.

FIG. 5b shows a top view of the wafer saw processing step processing step according to one embodiment. In this case, dies 302 are shown with film 306. Blue tape 204 is under dies 302. FIG. 5b shows a wafer 202 from which dies 302 have been removed and only some dies remain.

Referring back to FIG. 1, a die bonding process is performed according to one embodiment. A first die bond machine may be used to attach a first die (die1) 302a to a lead frame. Die1 includes film 306. A second die bond machine may be used to attach another die2 to the lead frame. Die2 does not include film 306. Die2 may be attached using a solder paste or other adhesive.

Figure 6B:
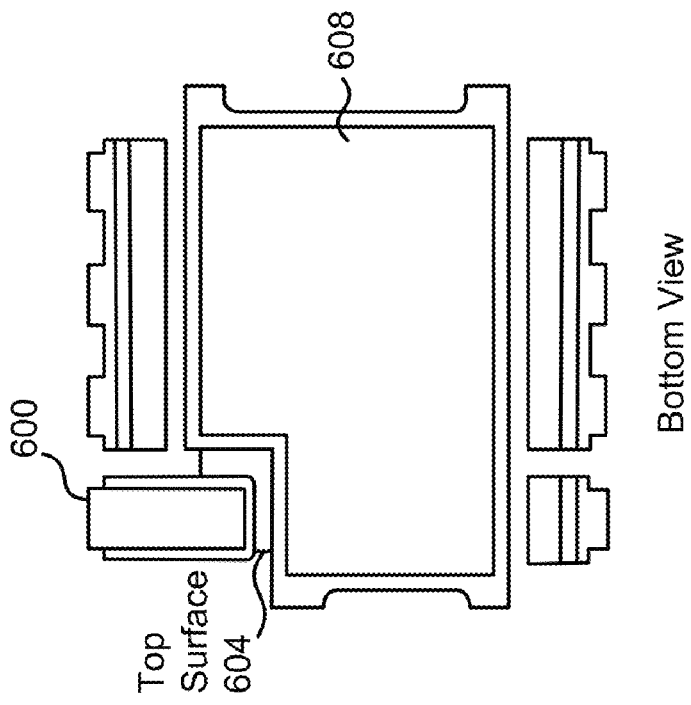
FIG. 6b shows a bottom view of the die bond processing step according to one embodiment.
Figure 6A:
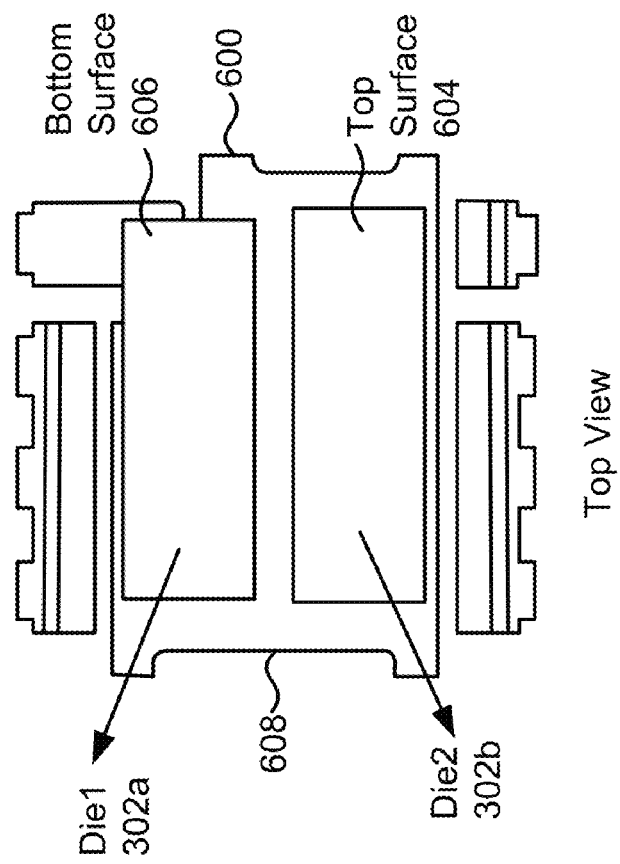
FIG. 6a shows a top view of the die bonding processing step according to one embodiment.

FIG. 6a shows a top view of the die bonding processing step according to one embodiment. Die1 302a is attached using a first bonding process, such as a flip bond process. This places a top surface of die1 302a down or facing a lead frame 600. Film 306 thus sits between die1 302a and lead frame 600. As shown, a bottom surface 602 of die1 302a is facing up or away from lead frame 600.

A die2 302b is attached using a second bonding processing step, such as a solder paste die attach bonding process. This places a top surface 604 of die2 302b facing up or away from lead frame 600. This results in a solder paste between a bottom surface of die2 302b and lead frame 600.

Also, a die pad 608 is provided that includes both die1 302a and die2 302b. Thus, a single die pad 608 is used for both die1 302a and die2 302b. A single die pad 608 may be used because two bonding processes are used where the top portion of die1 302a is coupled to die pad 608 through films 306 and the bottom of die2 302b is coupled to a lead of die pad 608 through solder paste.

FIG. 6b shows a bottom view of the die bond processing step according to one embodiment. As shown, a top surface 606 of die1 302a is coupled to lead frame 600.

In one embodiment, the chip bonding technology uses metal sheets (such as copper sheets) to replace the metal lead welding wires in order to achieve electrical connection between the chip bonding pads and the lead pins on the lead wire frame. The cross section surface access and surface area of metal sheets are both larger than those of metal wires; therefore, the achieved electrical connection structure has a lower series resistance and better cooling efficiency.

Referring back to FIG. 1, at 06, a clip bonding processing step is performed. A clip bond machine may be used to attach clips to die1 32a and die2 302b. In one embodiment, a clip bond is used instead of a wire bond. This saves space on lead frame 600, which uses space efficiently, and makes a resulting package smaller. This also may improve thermal performance of the package.

FIG. 7a shows an example of a clip bond processing step according to one embodiment. Clips 702 may be used to bond die1 302a and die2 302b to lead frame 600. For example, a first clip 702a bonds a drain1 of die1 302a to lead frame 600a. A gate1 is attached to lead frame section 600b. Also, a source1 of die1 is attached to a lead frame section 600c. A clip 702b is used to attach a source2 of die2 in lead frame section 600d. A clip 702c is used to attach a gate2 to a lead frame section 600e. A drain2 is attached to a lead frame section 600f.

FIG. 7b shows a side view of the clip bond processing step according to one embodiment. As shown, die1 302a and die2 302b are attached to die pad 608. Clip 702a is used to attach bottom surface 602 of die1 302a to lead frame section 600a. Also, clip 702b is used to attach top surface 604 to lead frame section 600d. Also, clip 702c is used to attach die2 302b to lead frame section 600e.

The front surface of die1 302a and die2 302b are both fitted with a source and a grid, and the back surface fitted with a drain (the chip surface electrodes are not shown in the diagram). Lead frame 600 is provided with a plurality of lead pins, which includes lead pins 600a-600e. The number of lead pins can increase or decrease according to the number of bonding pads in other embodiments.

Die1 302a and die2 302b are mounted side by side on lead frame 600, with the front surface of die1 302a and the back surface of die2 302b facing towards lead frame 600. The drain on the back surface of die2 302b and the source of die1 302a are mounted on the same lead pin 608 of lead frame 600. In the dual MOSFET encapsulation structure applied in a CMOS circuit, the source of one MOSFET (such as PMOS) and the drain of the other MOSFET (such as NMOS) are often connected together by series connection, which is convenient for the application of the subsequent circuits. The package structure of the particular embodiments utilize this feature, as two MOSFET chips are mounted upside down onto the lead wire frame, and the drain of one chip and the source of another chip are mounted on the same lead pin. This reduces the chip volume, as well as accomplishing the interconnection of two chips. Specifically, in order to enable interconnection between the source of one chip and the drain of another chip, conventionally either a lead wire is used to go across the front and the back of the chip, or the two chips are interlaced up and down. In both cases this will result in increased thickness of the package, which does not assist in either reducing the chip volume or improving cooling efficiency. Particular embodiments place the two chips upside down, which avoids increasing the package thickness, while the chip is directly attached to the lead pins of lead frame 600, which is conducive to boosting the cooling efficiency of the encapsulation structure.

From the schematic diagram of the three-dimensional structure of the package shown in FIG. 7b, it can be seen that the lead pins of the two grids are located at the two sides of the package. The lead pins of separate source and drain are also located at the two sides, and the shared lead pins of the source and drain for both chips are located in the centre of the chip, such pin arrangement reduces the degree of difficulty for subsequent PCB design.

Die1 302a and die2 302b are pasted together with the lead pins 608 and 600b of lead frame 600 by using conductive film. The range of the thickness of the conductive film is between 10 μm and 50 μm. The conductive film is a resin film with metallic composition. The metal may be silver. The conductive film further contains solder. In comparison with the metallic balls (such as gold balls) welding structure conventionally, conductive film is thinner, which further reduces the chip thickness as well as bringing the chip and lead pins closer together, which assists in allowing the heat generated by the chip to be transmitted through the lead pins to the environment more efficiently.

The source and grid of the front surface of die1 302a and the drain on the back surface of die2 302b are connected to the according pin 600d, 600e and 600a of lead frame 600 using clips 702b, 702c, and 702a. Clips (e.g., metal sheets (such as copper sheets)) replace the metal lead welding wires in order to realize electrical connection between the chip bonding pads and the lead pins on lead frame 600. The cross section surface access and surface area of the clips are both larger than those of metal wires; therefore, the resulting electrical connection structure has a lower series resistance and better cooling efficiency.

Thus, a clip 702a is used to attach drain1 to lead frame section 600a. No clip is used to attach drain2 of die2 302b to lead frame section 600f. A clip 702b is used to attach source2 of die2 302b to lead frame section 600d. No clip is used to attach source1 of die1 302a to lead frame section 600c. Rather, source1 is attached via film 306. Also, clip 702c is used to attach gate2 of die2 302b to lead frame section 600b. No clip is used to attach drain2 of die1 302a to lead frame section 600e. Rather, drain2 is attached via solder paste.

Figure 8:
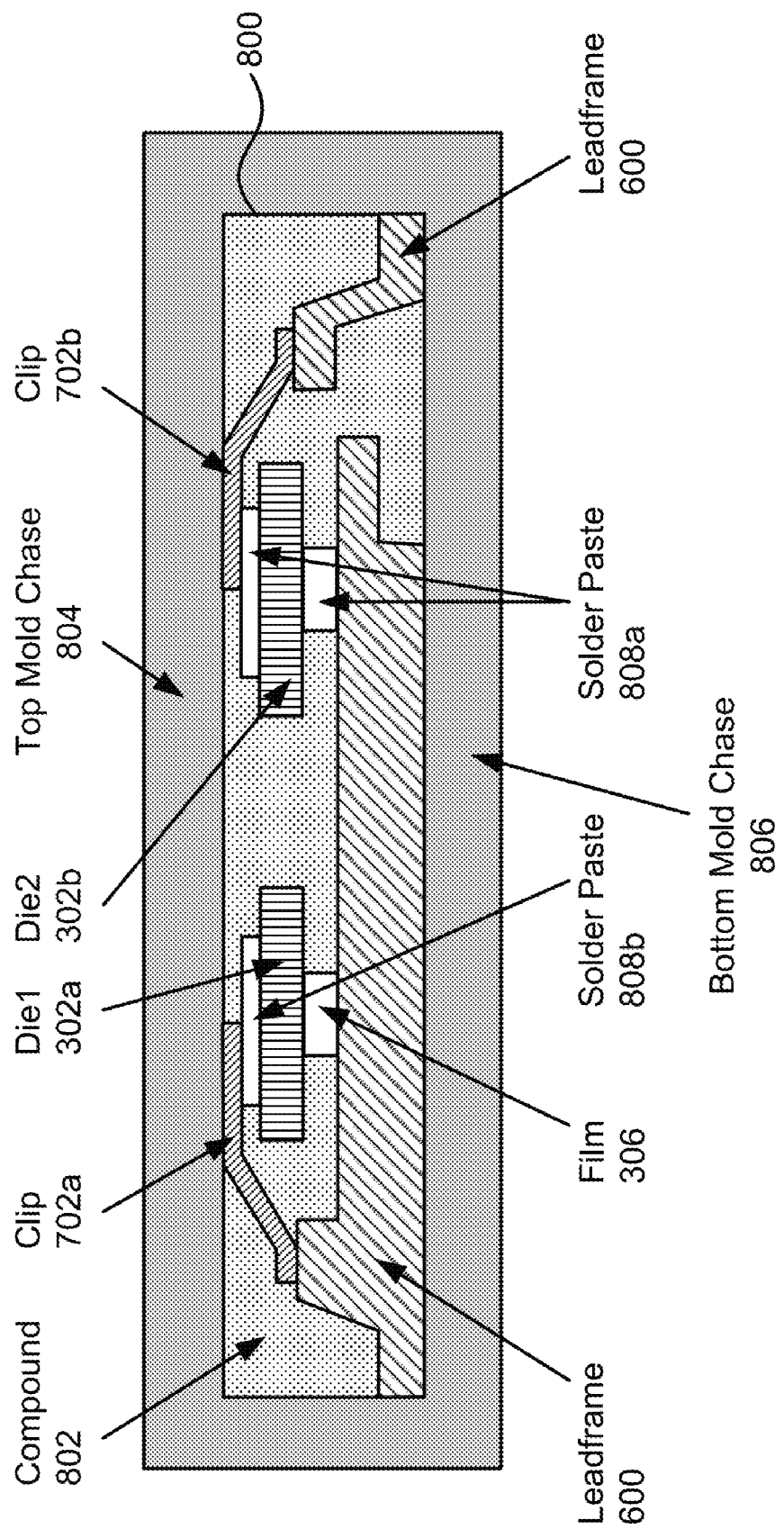
FIG. 8 depicts an example of the molding processing step to form a package according to one embodiment.

Referring back to FIG. 1, a molding processing step is performed at 07. FIG. 8 depicts an example of the molding processing step to form a package 800 according to one embodiment. A top mold chase 804 and a bottom mold chase 806 are used to inject a compound 802 that encapsulates die1 302a and die2 302b. As shown, a film 306 couples die1 to lead frame 600. Also, a solder paste 808a couples die2 302b to lead frame 600 and to clip 702b and a solder paste 808b couples clip 702a to die1 302a. As shown, clip 702a and 702b are exposed from package 800. Because clip 702a and 702b are connected directly to the die1 302a and die2 302b, the exposure of the conductive metal sheets favors the heat dispersion of the chip. Also, lead frame 600 is exposed from the bottom surface of package 800.

Because film 306 is conductive, source1 of die1 302a is coupled to lead frame 600. Solder paste 808a also couples drain2 of die2 302b to lead frame 600. Using the two different bonding methods, both die1 and die2 are placed on die pad 608.

Referring back to FIG. 1, at 08, a singulation saw processing step is performed. A singulation saw machine may be used to singulate packages into single packages. Other methods may be used, such as punch.

FIG. 9a shows a top view of a package 800 according to one embodiment. As shown, clips 700 are exposed from a top surface of package 800. For example, clip 702a and clip 702b are exposed. This provides contacts for drain1 of die1 302a and source2 of die2 302b. Also, the size of package 800 is reduced because clips 700 are exposed.

FIG. 9b shows a bottom view of package 800 according to one embodiment. An exposed die pad 608 is shown. Also, lead frame sections 600a, 600b, and 600d are provided as contacts.

Accordingly, two semiconductor dies (semiconductor devices, such as MOSFETS) are included in a single package 800. Multiple layers of a trace overlap in a PCB design does not need to be used because of the design of package 800. For example, a trace overlap does not occur because die1 is mounted using a flip chip and die2 is mounted using a normal die bond process. This allows the gates of package 800 to be coupled to a single layer of a PCB. This is because the gate of one gate is coupled to lead frame 600 using film 306 and a second gate is coupled to lead frame 600 using clip 702c. The flip chip design allows no cross circuit design so as one layer PCB can be applicable.

One different is there is no pasting of the conductive film onto the pads onto the back surface of die2 302b. In addition, die2 302b and lead frame 600 are welded together with conductive solder. The conductive solder contains metal and resin. Because direct welding using solder is much easier than pasting of the graphically arrayed conductive film, the advantage of this is to reduce the complexity of the process; therefore it is a preferred technical scheme.

In other embodiments, the connection between die1 302a and lead frame 600 can also use conductive solder. But because the connected parts of die1 302a with lead frame 600 are the source and grid on the front surface, the area of the bonding pads is considerably smaller than the area of the drain pads on the back surface of the second chip, and the distance between the pads of the source and grids is short, making it prone to solder leakage in the welding process. In serious cases this can cause a breakover of the source and grid that leads to chip failure. Therefore, although the technical scheme of connecting die1 302a and lead frame 600by using conductive solder is possible, the technical scheme of pasting of die1 302a to the lead frame 600by using conductive film is advantages.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method comprising:
    attaching a film on a tape in a position to cover a first portion of a first semiconductor die;
    attaching, using the tape, the film to the first semiconductor die to cover the first position on the first semiconductor die;
    bonding the first semiconductor die to a lead frame using a first bonding method, the first bonding method placing the film between the lead frame and the semiconductor die;
    bonding a second semiconductor die to the lead frame using a second bonding method, the second bonding method bonding the lead frame and the semiconductor die; and
    molding the first semiconductor device and the second semiconductor device into a semiconductor package.

2. The method of claim 1, wherein the tape comprises a second tape, the method further comprising:
    placing a first tape onto a wafer; and
    placing the film onto the second tape, wherein the film is shaped to cover the first portion of a plurality of semiconductor dies on the wafer.

3. The method of claim 2, further comprising shaping the film to be a plurality of single die sizes at a position corresponding to a plurality of die pad positions on the plurality of semiconductor dies.

4. The method of claim 2, further comprising:
    placing the second tape and the film onto the wafer; and
    attaching the film to the first portion of the plurality of semiconductor dies.

5. The method of claim 4, further comprising removing the second tape after attaching the film to the first portion of the plurality of semiconductor dies.

6. The method of claim 2, further comprising sawing the wafer to singulate the plurality of semiconductor dies.

7. The method of claim 1, wherein the first bonding process comprising a flip bond process, wherein a top side of the first semiconductor die faces the lead frame.

8. The method of claim 7, wherein the second bonding process comprising a solder paste bond process, wherein a bottom side of the second semiconductor die is bonded to the lead frame using a paste.

9. The method of claim 1, further comprising attaching one or more clips between the lead frame and the first semiconductor die or the second semiconductor die.

10. The method of claim 9, wherein the one or more clips are exposed from the package.

11. The method of claim 1, further comprising sawing the package to singulate the package from a set of other packages.

12. A method comprising:
    attaching a first tape onto a wafer;
    attaching a film onto a second tape to cover a portion of a plurality of semiconductor dies on the wafer;
    attaching, using the second tape, the film to the plurality of semiconductor dies on the wafer; and
    singulating the plurality of semiconductor dies on the wafer,
    wherein:
    a first semiconductor die from the plurality of singulated semiconductor dies is bonded to a lead frame using a first bonding method placing a top surface of the first semiconductor die including the film facing the lead frame; and a second semiconductor die is bonded to the lead frame using a second bonding method placing a bottom surface of the second semiconductor die facing the lead frame.

13. The method of claim 12, wherein attaching the film comprises applying a heat at a temperature to attach the film to the plurality of semiconductor dies.

14. The method of claim 13, wherein the temperature is substantially a same temperature that is applied to attach the first tape to the wafer.

15. The method of claim 12, further comprising shaping the film to be a plurality of single die sizes at a position corresponding to a plurality of die pad positions on the plurality of semiconductor dies.

16. The method of claim 12, wherein the first bonding process comprising a flip bond process, wherein the film is attached to the top surface of the first semiconductor die and the lead frame.

17. The method of claim 16, wherein the second bonding process comprising a solder paste bond process, wherein a solder paste is attached to the bottom surface of the second semiconductor die and the lead frame.

18. The method of claim 12, further comprising attaching one or more clips between the lead frame and the first semiconductor die or the second semiconductor die.

19. A semiconductor package comprising:
a lead frame including a die pad;
a first semiconductor die including a top surface coupled to the die pad using a film;
a second semiconductor die including a bottom surface coupled to the die pad;
an encapsulation molding to encapsulate the first semiconductor device and the second semiconductor device into the semiconductor package,
wherein:
a bottom surface of the first semiconductor die is exposed from the encapsulation via a first bond to the bottom surface of the first semiconductor die,
a top surface of the second semiconductor die is exposed from the encapsulation via a second bond to the top surface of the second semiconductor die, and
the die pad is exposed from the encapsulation.

20. The package of claim 19, further comprising:
a first clip bonded to the bottom surface of the first semiconductor die, the first clip being exposed from the encapsulation; and
a second clip bonded to the top surface of the second semiconductor die, the second clip being exposed from the encapsulation.

* * * * *